(12) United States Patent
Yu et al.

(10) Patent No.: US 11,264,081 B1
(45) Date of Patent: Mar. 1, 2022

(54) MEMORY CIRCUIT, ELECTRONIC DEVICE HAVING THE MEMORY CIRCUIT, AND METHOD OF OPERATING MEMORY CIRCUIT

(71) Applicant: Taiwan Semiconductor Manufacturing Company, Ltd., Hsinchu (TW)

(72) Inventors: Hua-Hsin Yu, Hsinchu (TW); Cheng-Hung Lee, Hsinchu (TW); Hung-Jen Liao, Hsin-Chu (TW); Hau-Tai Shieh, Hsinchu (TW)

(73) Assignee: Taiwan Semiconductor Manfacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/006,882

(22) Filed: Aug. 30, 2020

(51) Int. Cl.
*G11C 11/4091* (2006.01)
*G11C 11/4074* (2006.01)
*G11C 11/4076* (2006.01)
*G11C 11/4099* (2006.01)
*G11C 7/10* (2006.01)

(52) U.S. Cl.
CPC .......... *G11C 11/4091* (2013.01); *G11C 7/106* (2013.01); *G11C 7/1087* (2013.01); *G11C 11/4074* (2013.01); *G11C 11/4076* (2013.01); *G11C 11/4099* (2013.01)

(58) Field of Classification Search
CPC ............ G11C 11/4091; G11C 11/4076; G11C 11/4099; G11C 7/106; G11C 11/4074; G11C 7/1087
See application file for complete search history.

(56) References Cited

U.S. PATENT DOCUMENTS

| 7,479,818 | B2 * | 1/2009 | Park | G11C 7/065 327/218 |
|---|---|---|---|---|
| 2014/0211545 | A1 * | 7/2014 | Nagata | G11C 11/4076 365/149 |
| 2019/0377401 | A1 * | 12/2019 | Maeda | G11C 11/40 |

* cited by examiner

*Primary Examiner* — Tri M Hoang
(74) *Attorney, Agent, or Firm* — JCIPRNET

(57) ABSTRACT

The disclosure is directed to a memory circuit, an electronic device, and a method of operating the memory circuit. According to an exemplary embodiment, the disclosure is directed to a memory circuit which includes not limited to a voltage equalizing circuit configured to equalize and precharge a first data line and a second data line to a reference voltage, a sense amplifier circuit configured to sense a binary data based on a relative voltage between the first data line and the second data line, a read-out latch circuit configured to receive the binary data which is to be transmitted to an external controller, and a write circuit configured to receive a first signal of the first data line and a second signal of the second data line so as to write the first signal to a first bit line and the second signal to a second bit line.

13 Claims, 8 Drawing Sheets

MEMORY CIRCUIT, ELECTRONIC DEVICE HAVING THE MEMORY CIRCUIT, AND METHOD OF OPERATING MEMORY CIRCUIT

BACKGROUND

Conventionally, a memory circuit contains a storage cell which could be, for example, a capacitive or a resistive storage connected to an access transistor for storing a binary bit. A plurality of such storage cells would typically be connected together and activated by a word line as the activation of the word line would enable each cell to be read or written through a bitline (BL). In order to access the binary bit stored in each storage cell, a read operation could be performed on a storage cell by accessing the signal stored in the storage cell through a sense amplifier. A write operation could also be performed on the storage cell by using a write driver to write a binary value into the storage cell by asserting a voltage on the BL.

Typically, a sense amplifier could be connected multiple storage cells and would amplify and translate the signal stored in a storage cell as either a binary 0 or a binary 1. A read operation would typically involve a series of steps which includes a pre-charge operation for charging a reference voltage used by a sense amplifier to be close to its intended voltage. As for the write operation, a write driver would typically include a write-in latch and a write circuit. The write in latch is for receiving and temporarily a voltage corresponding to the binary value to be written into the storage cell, and a write circuit is for writing the voltage corresponding to the binary value into the storage cell.

FIG. 1 shows a known memory circuit which includes not limited to a storage cell 101, a sense amplifier 102, a voltage equalizing circuit 103, a read-out latch 104, a write circuit 105, and a write-in latch 106. The storage cell 101 could be any storage circuit such as a dynamic random access memory (DRAM) circuit, a static random access memory (SRAM), a resistive random access memory (SRAM), a flash memory circuit, and so forth and is configured to store a signal which could be converted into a binary value. The sense amplifier 102 could be electrically connected to the storage cell 101 and is configured to amplifier and convert the signal stored in the storage cell 101 into a binary value. The voltage equalizing circuit 103 could be an inherent part of the sense amplifier 102 and is configured to equalize the voltages across two input ends of the sense amplifier 102 to a reference voltage.

The read-out latch 104 could be electrically connected to the sense amplifier 102 and is configured to temporarily store the binary value which has been read out from the storage cell 101 and determined by the sense amplifier 102 so that the binary value could be sent to an external memory controller or written back into to the storage cell 101 during a refresh process if necessary. The write-in latch 106 is configured to receive a data from an external memory controller and temporarily store the data. The write circuit 105 could be electrically connected to the write-in latch 106 and is configured to receive the data stored in the write-in latch 106 in order to write the data into the storage cell 101. Overall, the memory circuit has a read path 111 for reading from the storage cell 101 and a write path 112 for writing into the storage cell 101. For the read path 111, the data may traverse through the storage cell 101, the sense amplifier 102, and the read-out latch 104. For the write path, the data may transverse through the write-in latch 106, the write circuit 105, and the storage cell.

For the typical memory circuit as described above, the sense amplifier and the write-in latch would usually co-exist in the memory circuit. However, the write-in latches are usually idle during a read operation while the sense amplifier for the read operation is being reset and recharged and thus is temporarily not available for performing the read operation. This means that while the read operation is being performed, the write-in latch is not operating, and while the operation is being performed, the sense amplifier is not operating. Such scenario might not be optimal since idleness may lead to inefficiency. While the part of the memory circuit is idle, the part the memory circuit may still consume power due to the presence of leakage currents. Therefore, a memory circuit could be redesigned to minimize or eliminate an inoperative part while maintaining the same function in order address the above described issues.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

Figure 1:
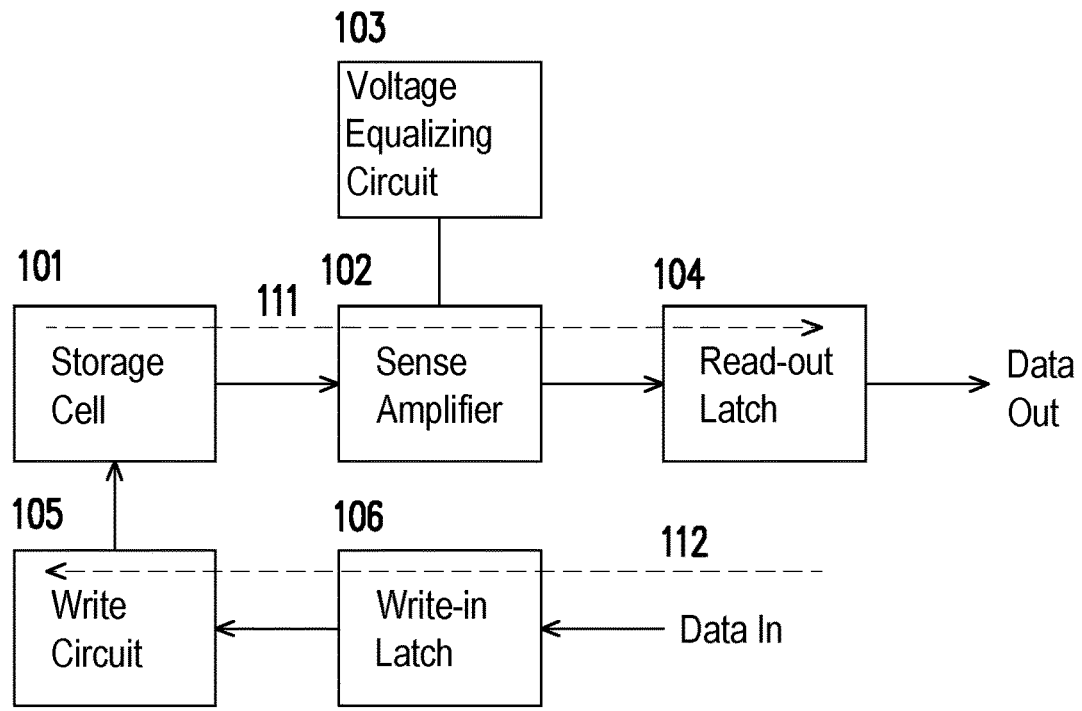
FIG. 1 is a hardware block diagram of a known memory circuit.

Reference will now be made in detail to the present exemplary embodiments of the disclosure, examples of which are illustrated in the accompanying drawings. Wherever possible, the same reference numbers are used in the drawings and the description to refer to the same or like parts.

As described previously, a sense amplifier for performing a read operation and a write-in latch for performing a write operation usually would not operate simultaneously as the write-in latch could be idle during a read operation and the sense amplifier is being pre-charged during a write operation. Thus, the disclosure addressed such issue by providing a memory circuit, an electronic device having a memory device which has the memory circuit, and a method of operating a memory circuit. The disclosure replaces a write-in latch by modifying an existing sense amplifier so as to reduce the area taken up by the original write-in latch. By doing so, the power consumption and the leakage current may also be reduced since the replacement does require any additional power consumption nor introduces new leakage current.

Figure 2:
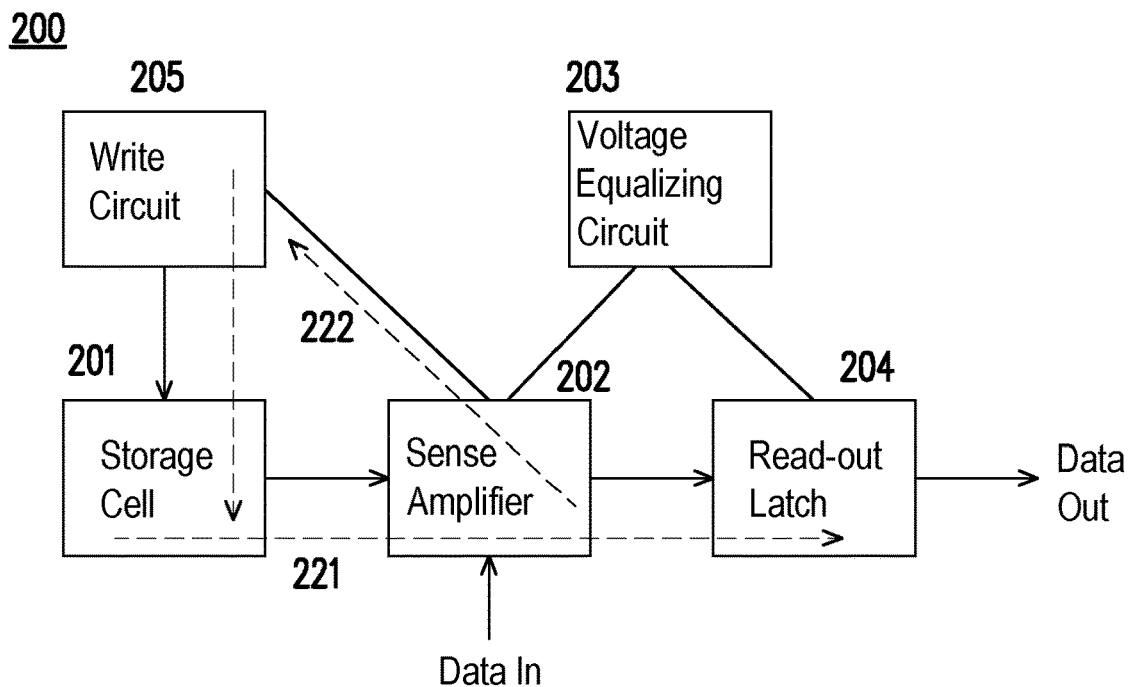
FIG. 2 is a hardware block diagram of a memory circuit according to an exemplary embodiment of the disclosure.

FIG. 2 is a hardware block diagram which illustrates a memory circuit 200 according to an exemplary embodiment of the disclosure. Note that FIG. 2 uses reference signs from other figures as examples. The memory circuit 200 would include not limited to a voltage equalizing circuit 203 (e.g. T1 T2 T3) configured to equalize and pre-charge a first data line (e.g. DL) and a second data line (e.g. DLB) to a reference voltage (Vr) upon receive a data line equalizing bar signal (e.g. DLEQB), a sense amplifier circuit 202 electrically connected to the voltage equalizing circuit 203 and configured to sense a binary data based on a relative voltage between the first data line (e.g. DL) and the second data line (e.g. DLB), a read-out latch circuit 204 electrically connected to the sense amplifier circuit 202 and configured to receive the binary data which is to be transmitted to an external controller (e.g. 302), and a write circuit 205 electrically connected to the voltage equalizing circuit 203 and configured to receive a first signal of the first data line (e.g. DL) and a second signal of the second data line (e.g. DLB) so as to write the first signal to a first bit line (e.g. BL) and the second signal to a second bit line (e.g. BLB).

The sense amplifier circuit may further include a comparator latch circuit (e.g. T4 T5 T6 T7) configured to sense the binary data based on the relative voltage between the reference voltage (e.g. Vr) on one of either the first data line (e.g. DL) or the second data line (e.g. DLB) and a low voltage on the other one of either the first data line (e.g. DL) or the second data line (e.g. DLB). The sense amplifier circuit 202 may further include a data-in transistor (e.g. $T_{DCK}$) electrically connected to the comparator latch circuit (e.g. T4 T5 T6 T7) and configured to receive a data-in clock (e.g. DCK) which turns on the data-in transistor (e.g. $T_{DCK}$) to activate the comparator latch circuit (e.g. T4 T5 T6 T7) so as to latch the first signal of the first data line (e.g. DL) and the second signal of the second data line (e.g. DLB).

The sense amplifier 202 circuit may further include a first data input transistor (e.g. TDin) configured to receive a data-in clock bar signal (e.g. DCKB) which turns on the first data input transistor (e.g. TDin) to receive a data input signal for the first data line (e.g. DL) and a second data input transistor (e.g. TDinB) configured to receive the data-in block bar signal (DCKB) which turns on the second data input transistor (e.g. TDinB) to receive a data-in bar signal (e.g. DinB) for the second data line (e.g. DLB) during a write operation. The data-in clock signal (e.g. DCK) may turn off the data-in transistor (e.g. TDCK) and the data-in clock bar signal (e.g. DCKB) may turn off the first data input transistor (e.g. TDin) and the second data input transistor (e.g. TDinB) during a read operation. The sense amplifier circuit 202 may further include a sense amplifier enable transistor (e.g. $T_{SAE}$) configured to receive a sense amplifier enabled signal (e.g. SAE) to turn on the sense amplifier enable transistor (e.g. $T_{SAE}$) which activates the comparator latch circuit (e.g. T4 T5 T6 T7) to sense the binary data during a read operation, and the sense amplifier enable transistor (e.g. $T_{SAE}$) is turned off during a write operation.

The voltage equalizing circuit 203 may include a first voltage equalizing transistor (e.g. T1) configured to pre-charge the first data line (e.g. DL) to the reference voltage (e.g. Vr) and a second voltage equalizing transistor (e.g. T2) configured to pre-charge the second data line (e.g. DLB) to the reference voltage (e.g. Vr) and a write enable transistor (e.g. T3) configured to receive the data line equalizing bar signal (e.g. DLEQB) which turns on the write enable transistor (e.g. T3) to enable the write circuit to write the first signal to the first bit line (e.g. BL) and the second signal to the second bit line (BLB) during a write operation. The write circuit may not contain a latch (e.g. 106) to receive the first signal of the first data line (e.g. DL) and the second signal of the second data line (e.g. DLB).

Overall, the memory circuit may have a read path 221 for reading from the storage cell 201 and a write path 222 for writing into the storage cell 201. For the read path 221, the data may traverse through the storage cell 201, the sense amplifier 202, and the read-out latch 204. For the write path 222, the data may transverse through the sense amplifier 202, the write circuit 205, and the storage cell.

Figure 3:
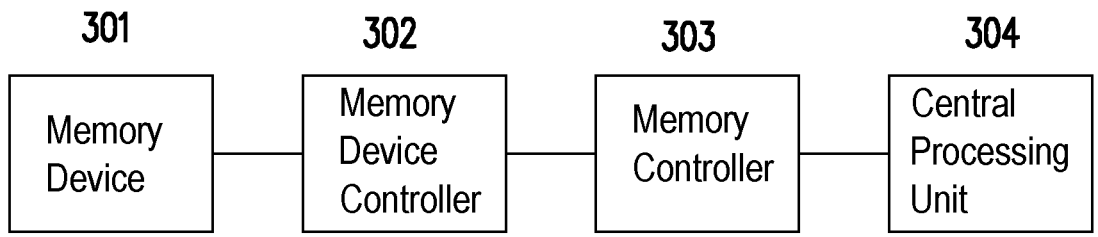
FIG. 3 is a hardware block diagram of an electronic device according to an exemplary embodiment of the disclosure.

A hardware block diagram of an electronic device 300 having the memory circuit (e.g. 200) is shown in FIG. 3. The electronic device 300 may contain a memory device 301 such as a SRAM device, a DRAM device, a RRAM device, a flash RAM device, and etc. The memory device 301 would typically exist a chip that is installed onto a motherboard of a computer or a mobile electronic device. The memory device 301 is typically connected to a memory device controller 302 (e.g. SRAM controller, DRAM controller). The memory device controller 302 is typically connected to a memory controller 303 which is connected to a central processing unit 304. Note that the configuration of FIG. 3 is usually well known except for the content of the memory device 301 such as the memory circuit (e.g. 200) and thus a repetition of the principle of operation would not be necessary.

Figure 4:
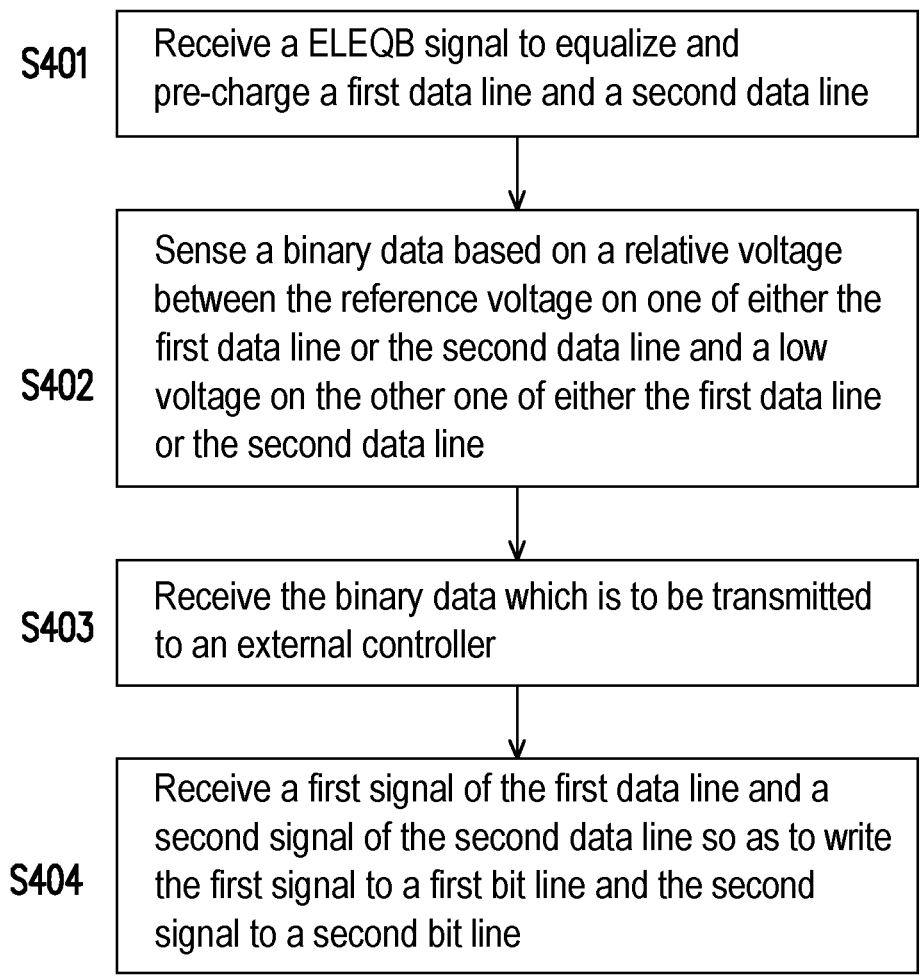
FIG. 4 is a flow chart which illustrates a method of operation a memory circuit according to an exemplary embodiment of the disclosure.

A method of operating the memory circuit (e.g. 200) is show in FIG. 4. In step S401, the memory circuit 200 would receive, by a voltage equalizing circuit 203, a data line equalizing bar signal (e.g. ELEQB) to equalize and pre-charge a first data line and a second data line. In step S402, the memory circuit 200 would sense, by a sense amplifier circuit 202 having a comparator latch circuit which is electrically connected to the voltage equalizing circuit 203, a binary data based on a relative voltage between the reference voltage on one of either the first data line or the second data line and a low voltage on the other one of either the first data line or the second data line. In step S403, the memory circuit 200 would receive, by a read-out latch circuit 204 electrically connected to the sense amplifier circuit 202, the binary data which is to be transmitted to an external controller (e.g. 302 303 or 304). In step S404, the memory circuit 202 would receive, by a write circuit 205 electrically connected to the voltage equalizing circuit 203, a first signal of the first data line and a second signal of the second data line so as to write the first signal to a first bit line and the second signal to a second bit line.

The memory circuit 200 may also receive a data-in block, by using a data-in transistor electrically connected to the comparator latch circuit, to turn on the data-in transistor which activates the comparator latch circuit so as to latch the first signal of the first data line and the second signal of the second data line; receive, by a first data input transistor, a data-in clock bar signal which turns on the first data input transistor to receive a data input signal for the first data line; receiving, by a second data input transistor, a data-in block bar signal which turns on the second data input transistor to receive a data in bar signal for the second data line during a write operation, wherein the data-in clock signal turns off the data-in transistor and the data-in clock bar signal turns off the first data input transistor and the second data input transistor during a read operation. Additionally, the memory circuit 200 may receive, by the sense amplifier circuit, a sense amplifier enabled signal to turn on the sense amplifier enable transistor which activates the comparator latch circuit to sense the binary data during a read operation, and the sense amplifier enable transistor is turned off during a write operation.

Figure 5:
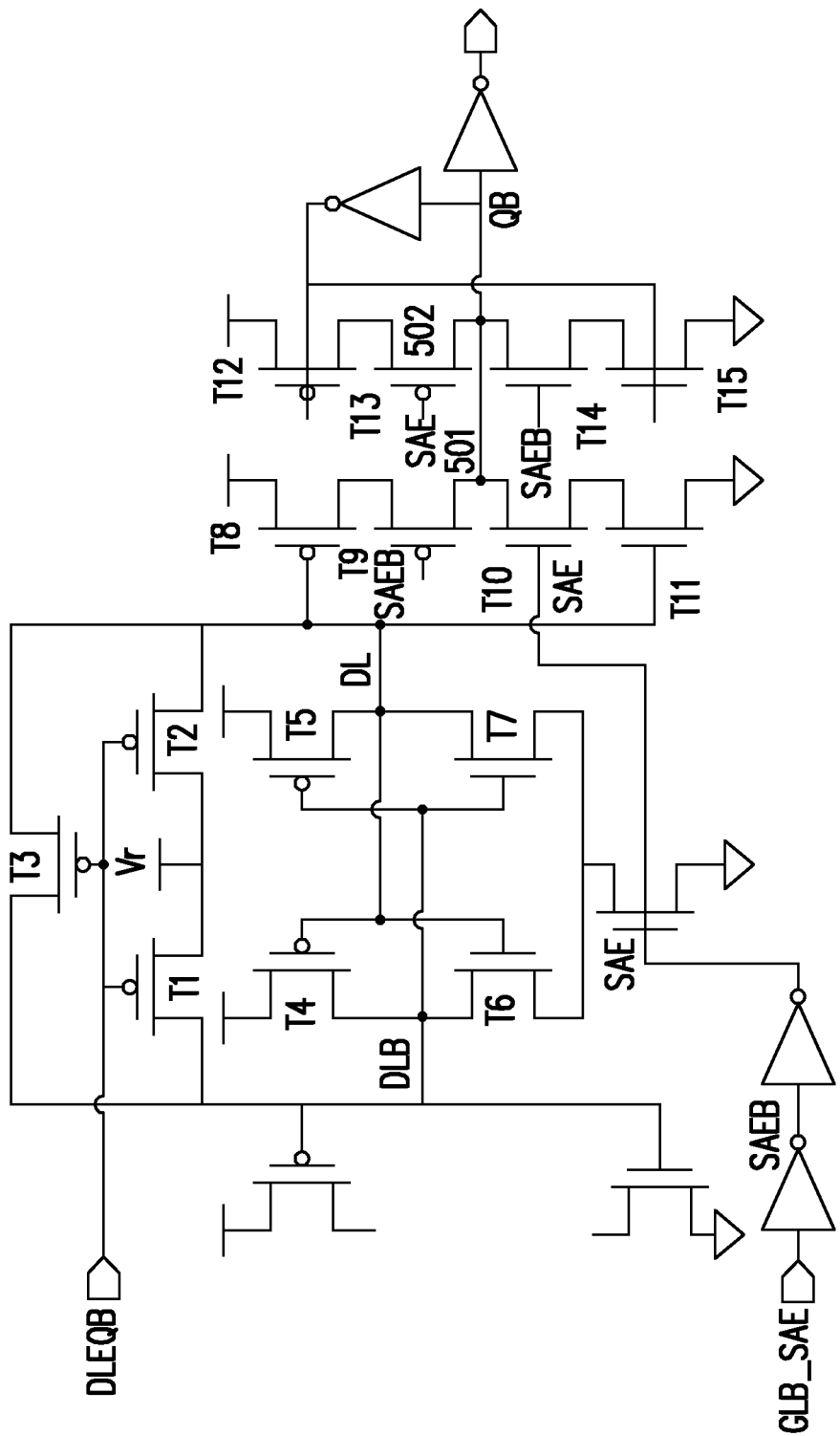
FIG. 5 is a circuit diagram of a sense amplifier circuit connected to a read-out latch according to an exemplary embodiment of the disclosure.

The principle of operation of the voltage equalizing circuit (e.g. 203), the sense amplifier (e.g. 202), and the read-out latch (e.g. 204) is to be further described in FIG. 5 which shows a circuit diagram of a sense amplifier circuit connected to a read-out latch and a voltage equalizing circuit. The voltage equalizing circuit 203 may include not limited to three transistors T1 T2 T3, and each of the gates of the three transistors T1 T2 T3 are connected to and controlled by the DLEQB signal. One of the drain terminal and the source terminal of the first transistor T1 is connected to a voltage reference Vr which could be a high voltage, and the other one of the drain terminal and the source terminal of the first transistor T1 is connected to the first data line which is the DLB in this example. Also, one of the drain terminal and the source terminal of the second transistor T2 is connected to a voltage reference Vr which could be a high voltage, and the other one of the drain terminal and the source terminal of the second transistor T2 is connected to the second data line which is the DL in this example. The purpose of the first transistor T1 and the second transistor T2 is to pre-charge and equalize the DLB and the DL to be close to the Vr voltage.

The sense amplifier circuit would include not limited to a comparator latch circuit which includes not limited to transistors T4, T5, T6, T7. The principle of operation of the transistors T4, T5, T6, T7 is similar to the SRAM latch which is currently well known. Essentially, the purpose comparator latch circuit is to sense the binary signal based on a comparison between DL and DLB. After the DL and DLB are pre-charged to Vr, for example a binary zero could be sensed based on a voltage on DBL remaining high while a voltage on DL is pulled low. Similarly, a binary one could be sensed based on a voltage on DBL pulled low while the voltage on DL remains high. However, the reverse may also be true and the disclosure is not limited to which one of the DBL and DL has to be pulled low to represent a binary one or a binary zero. The comparator latch circuit may momentarily store the binary signal within the transistors T4 T5 T6 T7, but the binary signal is to be transferred to the read-out latch (e.g. 204).

The read-out latch includes two columns of transistors. The first column of transistors may include not limited to transistors T8 T9 T10 T11, and the second column of transistors may include not limited to transistors T12 T13 T14 T15. In the first column, transistors T8 T9 are complimentary to transistors T10 T11. For example, a first set of transistors T8 and T9 could be P type transistors while a second set of transistors T10 and T11 could be N type transistors. Since the first set of transistors T8 T9 and the second set of transistors T10 T11 are different types, the voltage on DL would either turn on the first set of transistors T8 T9 and turn off the second set of transistors T10 T11 or would turn on the second set of transistors T10 T11 and turn off the first set of transistors T8 T9. When the first set of transistors T8 T9 are turned on, the voltage on first node 501 would approach the reference voltage which could be the high voltage, and when the second set of transistors T10 T11 are turned on, the voltage on first node 501 would approach the low voltage which could be a ground voltage. Essentially, the voltage on DL would set the voltage at the node 501 to be either the high voltage (reference voltage) or low voltage (ground voltage). The first node 501 is connected to the second node 502 to transfer the voltage from the first node 501 to the second node 502 so as to allow the voltage on the first node 501 to be stored in the second node 502 usually after one clock cycle.

For the exemplary embodiment of FIG. 5, the sense amplifier circuit would amplify binary data stored in the storage cell during a read operation, but the sense amplifier circuit would also have the capability of storing the binary data which could be sent to a read-out latch to be latched and eventually transmitted out of the memory circuit to be received by a memory (device) controller or a CPU. The sense amplifier circuit would be be reset and re-charged during a write operation and then the read and write cycle may repeat multiple times.

Figure 6:
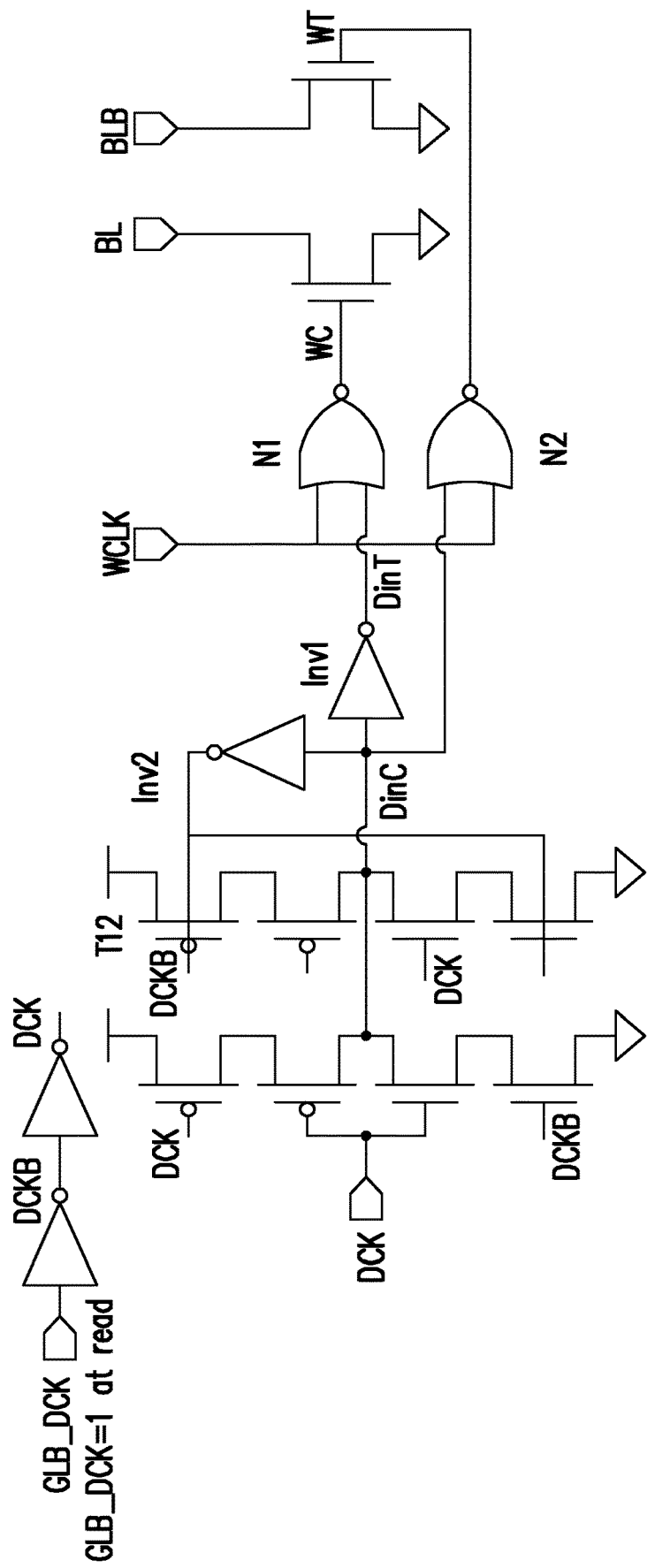
FIG. 6 is a circuit diagram of a write-in latch connected to a write circuit according to an exemplary embodiment of the disclosure.

The principle of operation of the write circuit (e.g. 205) is shown in FIG. 6. The write circuit may include not limited to a first NOR gate N1, a second NOR gate N2, a write truth (WT) transistor, and a write complement (WC) transistor. The first NOR gate N1 receives a write clock (WCLK) input and a data-in truth (DinT) input and output the WC driving signal as the result of the NOR operation between the WCLK input and the DinT input. The second NOR gate N2 receives the write clock (WCLK) input and a data-in complement (DinT) input and output the WT driving signal as the result of the NOR operation between the WCLK input and the DinC input. The WC driving signal turns on the WC transistor to write to the BL and the WT driving signal turns on the WT transistor to write to the BLB. The BL and BLB are complementary signals.

The write circuit (e.g. 205) may receive the DinT input and the DinC input from a temporarily storage mean such as a write-in latch. The DinT signal and the DinC signal are complementary signals. The write latch may include two columns of transistors similar to the exemplary embodiment of FIG. 5, a first inverter Inv1 and a second inverter Inv2. The DinC signal is reversed in polarity by the first inverter Inv1 to become DinT and is also reversed in polarity by the second inverter Inv2 to be sent to second column of transistors. The write-in latch may also receive a data clock signal (DCK) and a data block bar signal (DCKB) which are complementary signal. The DCK signal and the DCKB signal turns on two columns of transistors at various time points to control the voltages on BL and BLB. The voltages on BL and BLB are eventually translated into a binary signal to be written into the storage cell (e.g. 201). For the exemplary embodiment, the write-in latch may latch the data-in (Din) signal to be written into the memory cell and store the Din signal for one clock cycle, and the write-in latch would mostly be idle during a read operation.

Figure 7:
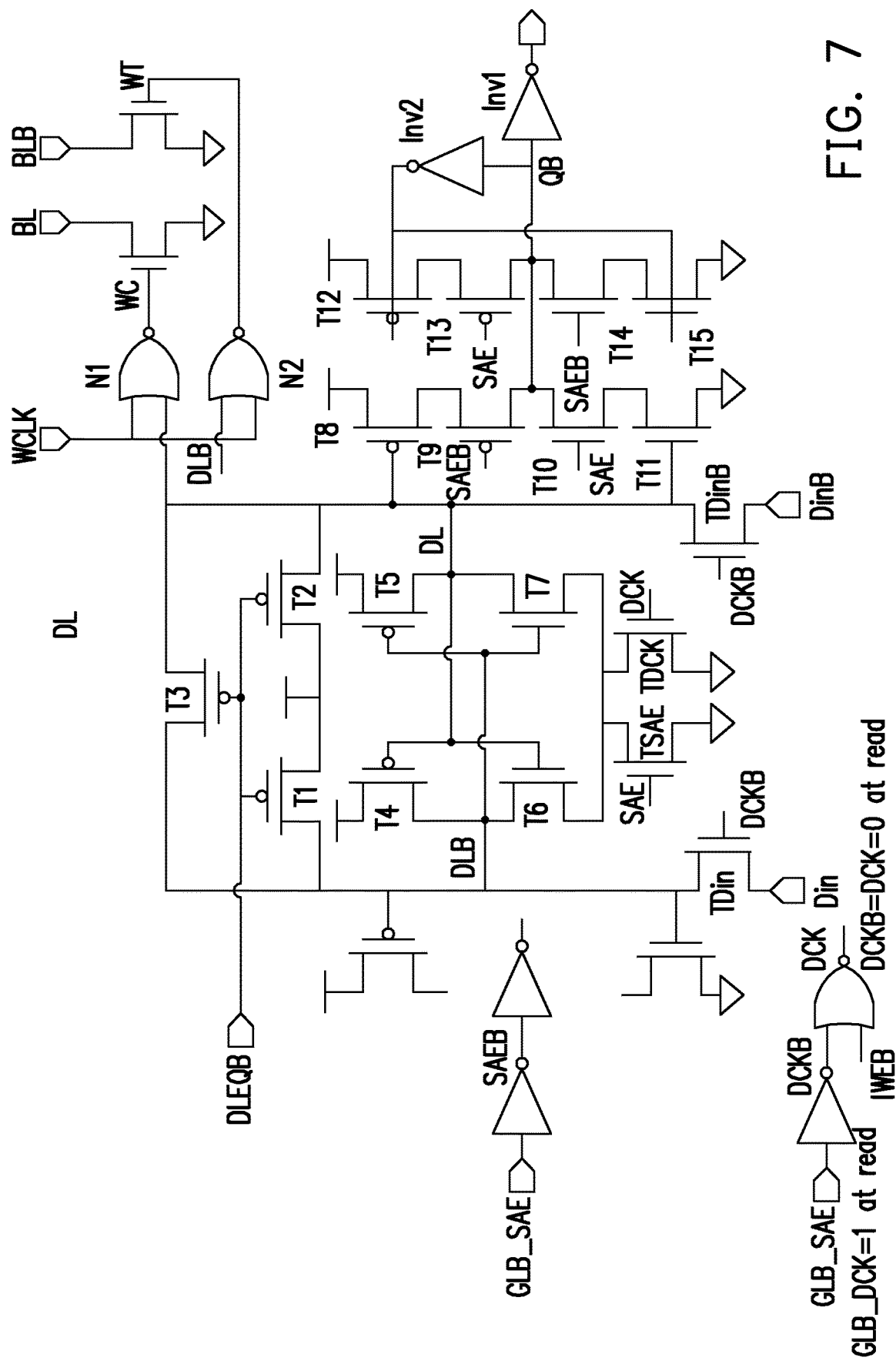
FIG. 7 is a circuit diagram of a memory circuit according to an exemplary embodiment of the disclosure.

The exemplary embodiments of FIG. 5 and FIG. 6 could be modified and shown as a combined circuit diagram in FIG. 7. For this exemplary embodiment, a write-in latch (e.g. 106) has been removed, and its function has been replaced by a modified sense amplifier circuit. The sense amplifier circuit and the read-out circuit are still mostly similar to the exemplary embodiment of FIG. 5 with a few modifications, but notice that the write circuit is directly connected to the voltage equalizing circuit as the write-in latch is missing and replaced. Also, in comparison to FIG. 5 and FIG. 6, a few transistors are added including the data-in transistor (TDin), the data-in bar transistor (DinB), the data clock transistor (DCK), the sense amplifier enabling (SAE)

transistor, and the DCK signal and DCKB signal are re-logic so that they are not fully complementary during a read operation. The principle of operation is to be explained as follows.

The voltage equalizing circuit 203 may include not limited to a first transistor T1, a second transistor T2, and a third transistor T3. The gates of the first transistor T1, the second transistor T2, and the third transistor T3 are connected together and controlled by the DLEQB signal. One of the drain terminal and the source terminal of the first transistor T1 is connected to a voltage reference Vr which could be a high voltage, and the other one of the drain terminal and the source terminal of the first transistor T1 is connected to the first data line which is the DLB in this example. Also, one of the drain terminal and the source terminal of the second transistor T2 is connected to a voltage reference Vr which could be a high voltage, and the other one of the drain terminal and the source terminal of the second transistor T2 is connected to the second data line which is the DL in this example. The purpose of the first transistor T1 and the second transistor T2 is to pre-charge and equalize the DLB and the DL to be close to the Vr voltage. The third transistor T3 may also be activated by the DLEQB signal which would allow the DL signal and the DLB signal to be transmitted to the write circuit.

The sense amplifier circuit would include not limited to a comparator latch circuit which includes not limited to transistors T4, T5, T6, T7. Similar to the exemplary embodiment of FIG. 5, the comparator latch circuit is configured to sense the binary signal based on a comparison between DL and DLB. For example, after the DL and DLB are pre-charged to Vr, a binary zero could be sensed based on a voltage on DBL remaining high while a voltage on DL is pulled low. Similarly, a binary one could be sensed based on a voltage on DBL pulled low while the voltage on DL remains high. However, the reverse may also be true and the disclosure is not limited to which one of the DBL and DL has to be pulled low to represent a binary one or a binary zero. The comparator latch circuit may temporarily store the binary signal within the transistors T4 T5 T6 T7 and eventually transferred to the read-out latch (e.g. 204) based on the control provided by the TDCK transistor.

Notice that one of the gate terminal and the drain terminal of the TDCK transistor is connected to transistors T6 and T7 and the other terminal is connected to a low voltage or a ground voltage. The TDCK transistor is controlled by the DCK signal which activates or deactivates the TDCK transistor to activate the comparator latch circuit or deactivates the comparator latch circuit. The sense amplifier circuit which includes the comparator latch circuit usually would not be operational during a write operation. However, during a write operation, the DCK signal may activate the comparator latch circuit which functions as a latch so that the binary data which has been sensed and stored by the comparator latch circuit could be transmitted to the write circuit during the write operation.

Similarly, the sense amplifier circuit may include a TSAE transistor. One of the gate terminal and the drain terminal of the TSAE transistor is connected to transistors T6 and T7 and the other terminal is connected to a low voltage or a ground voltage. The TSAE transistor is controlled by the SAE signal which activates or deactivates the TSAE transistor to activate the comparator latch circuit or deactivates the comparator latch circuit. During a read operation, the SAE signal would turn on the TSAI transistor to activate the sense amplifier circuit which includes the comparator latch circuit. However, during a write operation, the SAE signal would stay low to in order not to unnecessarily activate the comparator latch circuit which is controlled by the TDCK transistor during a write operation.

Furthermore, the sense amplifier circuit may include a TDin transistor and a TDinB transistor. The TDin transistor and the TDinB transistor are both controlled by the DCKB signal which turns on the TDin transistor to receive the Din signal and to turn on the TDinB transistor to receive the DinB signal. The Din signal and the DinB signal corresponds to a signal which is received from a storage cell and conveys a binary data that has been stored in the storage cell.

It is worth noting that the DCK and the DCKB signals are not fully complementary during a read operation as both DCK and DCKB are at a low voltage during the read operation. The DCKB signal is generated by a global data clock (GLB_DCK) signal which is sent to an inverter Inv 3. The output of the inverter Inv 3 reverses the GLB_DCK signal and generates the DCKB signal which is sent as an input to the NOR gate N3. The NOR gate N3 receives the DCKB signal and the internal write enable (IWEB) signal and performs an OR operation on the received inputs to generate the DCK signal. The DCK signal and the DCKB signal are complementary except during read operation when both the DCK signal and the DCKB signal are set at 0 voltage (or low voltage or ground voltage). It is also worth noting that the sense amplifier enable bar (SAEB) signal is generated by the inverter Inv4 which receives the global sense amplifier enable (GLB_SAE) signal. The SAEB signal is reversed in polarity by the inverter Inv5 which generates the sense amplifier enable (SAE) signal.

Similar to previous embodiment as shown in FIG. 5, the read-out latch also may include not limited to two columns of transistors. The first column of transistors may include not limited to transistors T8 T9 T10 T11, and the second column of transistors may include not limited to transistors T12 T13 T14 T15. In the first column, transistors T8 T9 are complimentary to transistors T10 T11. For example, a first set of transistors T8 and T9 could be P type transistors while a second set of transistors T10 and T11 could be N type transistors. Since the first set of transistors T8 T9 and the second set of transistors T10 T11 are different types, the voltage on DL would either turn on the first set of transistors T8 T9 and turn off the second set of transistors T10 T11 or would turn on the second set of transistors T10 T11 and turn off the first set of transistors T8 T9. The transistor T9 would receive the SAEB signal which controls the T9 transistor and thus controls when the first set of transistors T8 T9 is turned on during the read operation. The transistor T10 would also receive the SAE signal which controls the T10 transistor and thus controls when the second set of transistors T10 T11 is turned on during the read operation.

When the first set of transistors T8 T9 are turned on, the voltage on first node 701 would approach the reference voltage which could be the high voltage, and when the second set of transistors T10 T11 are turned on, the voltage on first node 701 would approach the low voltage which could be a ground voltage. Essentially, the voltage on DL would set the voltage at the node 701 to be either the high voltage (reference voltage) or low voltage (ground voltage). The first node 701 is connected to the second node 702 to transfer the voltage from the first node 701 to the second node 702 so as to allow the voltage on the first node 701 to be stored in the second node 702 usually after one clock cycle. The transistor T14 would receive the SAEB signal which controls the T14 transistor and thus controls when the fourth set of transistors T14 T15 is turned on during the read operation. The transistor T13 would also receive the SAE signal which controls the T13 transistor and thus controls when the third set of transistors T12 T13 is turned on during the read operation. The voltage node at 702 is output through the first inverter Inv1 but is looped back through the second inverter Inv2 to be received by the transistor T12 and the transistor T15. This allows the storage of the signal for one clock cycle.

Similar to the exemplary embodiment of FIG. 5, the sense amplifier circuit would amplify binary data stored in the storage cell during a read operation, but the sense amplifier circuit would store the binary data to be sent to a read-out latch to be latched and eventually transmitted out of the memory circuit to be received by a memory (device) controller or a CPU. During a write operation, the sense amplifier circuit would latch on the binary data received and sensed from a storage cell via Din and DinB as controlled by the TDCK transistor, and the binary data would be sent to the write circuit to be written. Also similar to the exemplary embodiment of FIG. 5, the sense amplifier circuit would be reset and re-charged during a write operation and then the read and write cycle may repeat multiple times.

The write circuit may include not limited to a first NOR gate N1, a second NOR gate N2, a write truth (WT) transistor, and a write complement (WC) transistor. The first NOR gate N1 receives a write clock (WCLK) input and the DL signal as input and output the WC driving signal as the result of the NOR operation between the WCLK input and the DL input. The second NOR gate N2 receives the write clock (WCLK) input and the DLB signal as input and output the WT driving signal as the result of the NOR operation between the WCLK input and the DLB signal. The WC driving signal turns on the WC transistor to write to the BL and the WT driving signal turns on the WT transistor to write to the BLB. The BL and BLB are complementary signals.

Figure 8:
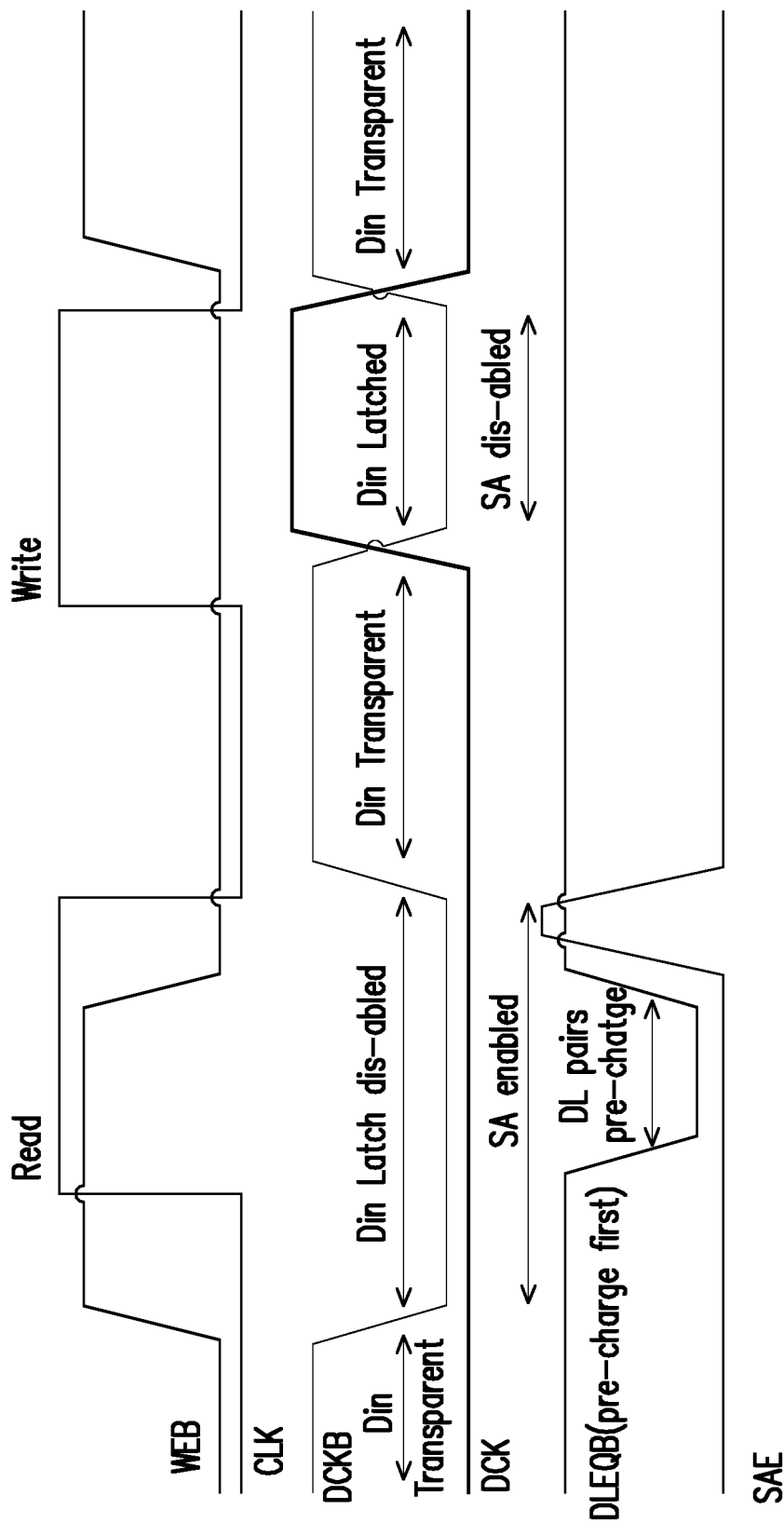
FIG. 8 illustrates is a timing diagram of the memory circuit of FIG. 7 according to an exemplary embodiment of the disclosure.

From another perspective, the principle of operation of the memory circuit could also be explained by using a timing diagram as shown in FIG. 8. In general, a cycle may include a read operation to be followed by a write operation, and the transistors of the comparator latch circuit (e.g. T4 T5 T6 T7) are first pre-charged before every read operation. After a period of pre-charge, the signals take turn on the transistor would come later since the transistors may take time to recharge. During a read operation, the DCK and the DCKB would remain low. The SAE signal would momentarily go high to activate the sensing function of the sense amplifier circuit. After the sensing function has been performed, the SAE signal would go low and remain low during the write operation. Before a data is latched during a write operation, the Din signal may go through a period during which the Din is considered transparent and the DCKB is set high. While the Din signal is latched, the DCK signal is set high.

Figure 9:
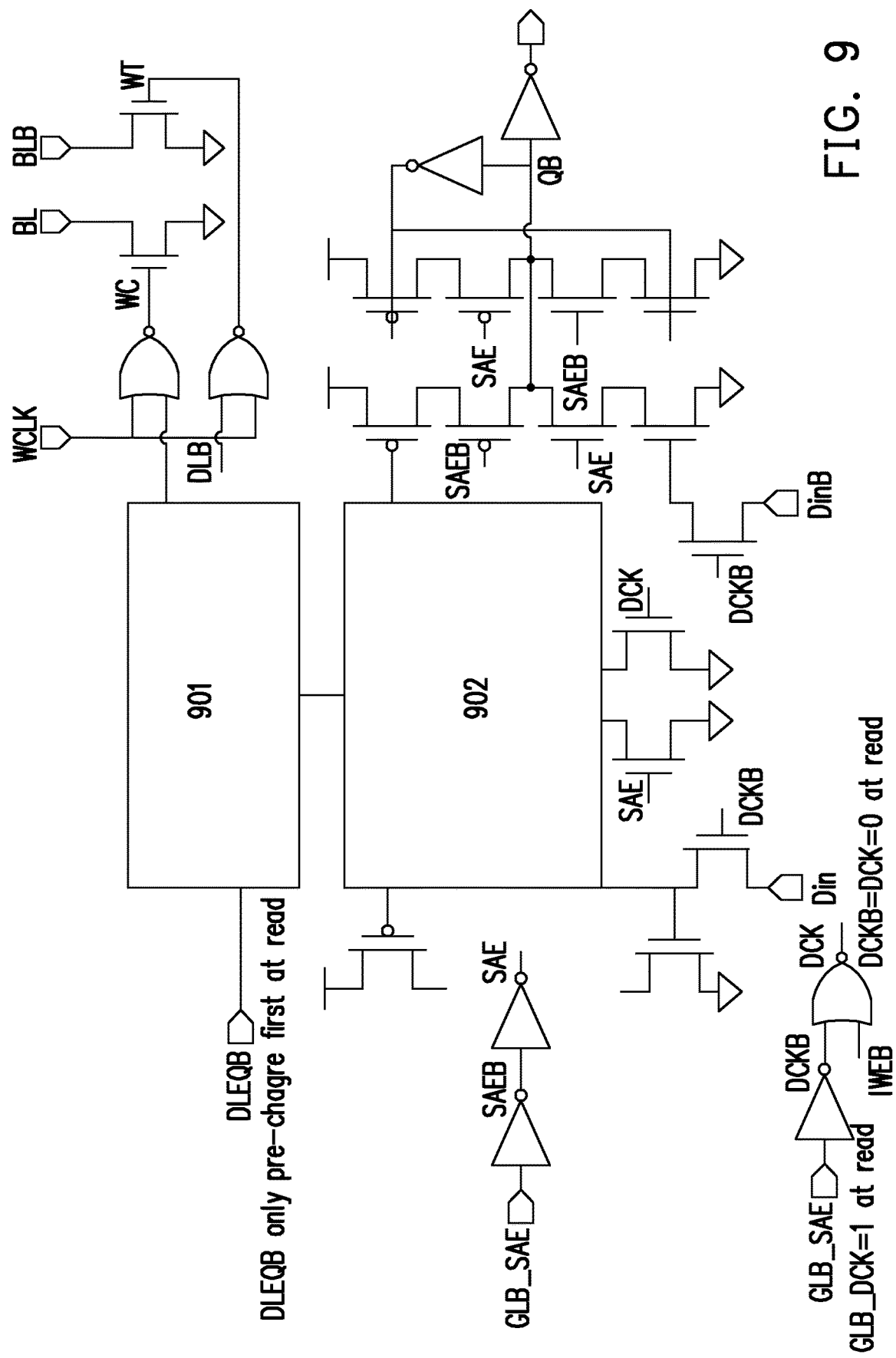
FIG. 9 illustrates an alternative embodiment of the memory circuit of FIG. 2.

In further detail, the DLEQB signal is first set high in order to turn on the voltage equalizing circuit (e.g. T1 T2 T3) to equalize and pre-charge the sense amplifier circuit. The DCKB is set high during the phase where the Din is transparent and is set low during the phase where the Din latch is disabled. The DCK signal is low throughout the read operation, and the SAE signal is also set low at the beginning of a read cycle. The voltage level of the write enable signal (WEB) during a rising clock edge triggers the start of a read operation or a write operation. In the example of FIG. 9, at a first rising clock edge 801, the WEB signal is set high to trigger a read operation during which the transistors of the sense amplifier circuit is enabled. The DLEQB signal is then set low after the pre-charge has finished. The SAE signal is then momentarily set high to perform sensing of the differential signals (e.g. DL, DLB) so as to sense the binary value.

As the SAE signal goes down to low voltage, the DCKB signal is set high while the Din is at a transparent phase. After the read operation is finished, the write operation may begin.

From the end of a read operation to the start of a write operation, the DLEQB signal may go up to high voltage in order to turn on the voltage equalizer circuit and pre-charge the sense amplifier throughout the write operation. At a second rising clock edge 802, the WEB signal is set low to trigger a write operation during which the transistors of the sense amplifier circuit are disable throughout. The DLEQB signal remains high until the beginning of the next cycle, and the SAE signal also remains low throughout the write operation since the sense amplifier circuit would not be needed during the write operation except to latch the data received via Din and DinB. In order to latch the data received from Din and DinB, the DCK signal would momentarily set high to perform sensing of the differential signals (e.g. DL, DLB) so as to sense the binary value and also to latch the binary value stored in the comparator latch circuit. At the start of the write operation, the DCKB signal is set high while the Din is at a transparent phase. While the data received from Din and DinB are being latched, the DCKB signal go low as the relationship between DCKB and DCK are complementary during a write operation. After the write operation is finished, another cycle of a read operation to be followed by a write operation may begin.

FIG. 9 shows an alternative embodiment of the memory circuit of FIG. 2. Alternatively, the voltage equalizer circuit 901 could be implemented by multiple operational amplifiers having capacitors instead of transistors. The voltage equalizer circuit 901 may also be implemented by individual integrated circuits and this disclosure does not limited the voltage equalizer circuit to the three transistor implementations. Also, alternatively, the sense amplifier circuit 902 not only can replace the write-in (data-input) latch, but bit write mask function (i.e. bit write enable bar) (BWEB) and design for test (DFT) mode, or any non-read mode latch may also be used to replace the sense amplifier circuit 902 since they may not operate at the same moment.

Figure 10:
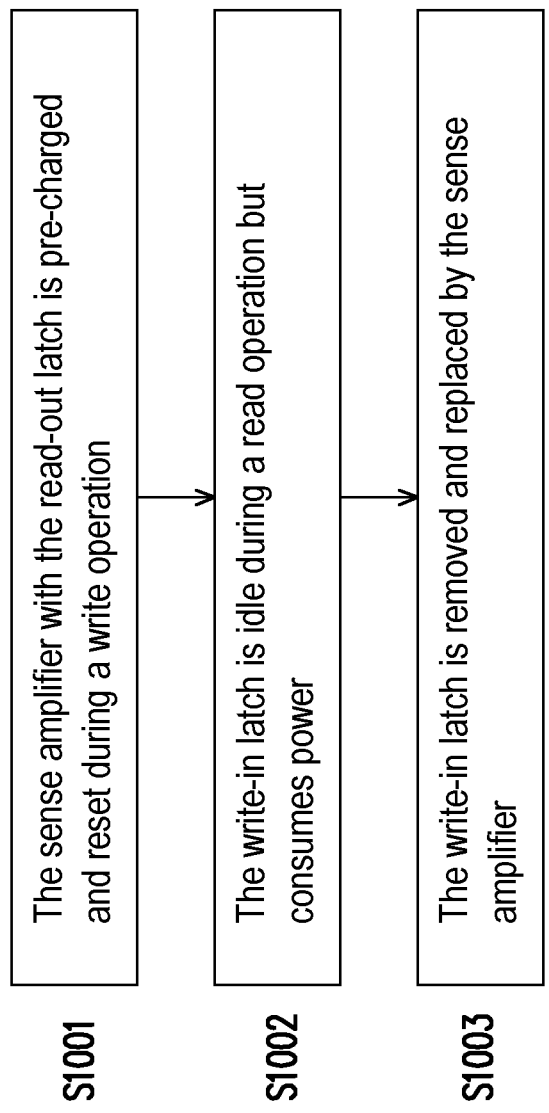
FIG. 10 is a flow chart which summarizes some of the features of the disclosure relative to the known memory circuit of FIG. 1.

FIG. 10 is a flow chart which summarizes some of the disclosed concepts of the disclosure relative to the known memory circuit of FIG. 1. For the known memory circuit of FIG. 1, the sense amplifier and read-out latch usually function mostly during a read operation but remain idle during a write operation while the write-in latch functions mostly during a write operation but remains idle during a read operation. In general, the time of activities between the sense amplifier with a read-out latch and the write-in latch are mutually exclusive and thus a modification of FIG. 1 is made to further reduce components that can potentially go inactive. Thus, the steps of modification are as follows. In S1001, the sense amplifier with the read-out latch is pre-charged and reset during a write operation. In S1002, the write-in latch is idle during a read operation but nevertheless consumes power. In S1003, the write-in latch is removed and replaced by the sense amplifier since the circuit of the sense amplifier which could be modified and reconfigured to perform a similar function as the write-in latch. As the result of the modification, the area on a die required for the write-in latch to be situated is reduced for each cell, the power consumption could be reduced since there is not an existing write-in latch to be toggled, and the leakage current may also be further reduced since the number of gate count would decrease as the result of removing the write-in latch.

In view of the aforementioned descriptions, the disclosure is suitable for being used in a memory device which could be installed in an electronic device and is able to reduce power consumption and further minimize leakage current of the memory device.

In summary, the disclosure is directed to a memory circuit, an electronic device having a memory device which contains the memory circuit, and a method of operating a method circuit.

According to an exemplary embodiment, the disclosure is directed to a memory circuit which includes not limited to a voltage equalizing circuit configured to equalize and pre-charge a first data line and a second data line to a reference voltage upon receive a data line equalizing bar signal, a sense amplifier circuit electrically connected to the voltage equalizing circuit and configured to sense a binary data based on a relative voltage between the first data line and the second data line, a read-out latch circuit electrically connected to the sense amplifier circuit and configured to receive the binary data which is to be transmitted to an external controller, and a write circuit electrically connected to the voltage equalizing circuit and configured to receive a first signal of the first data line and a second signal of the second data line so as to write the first signal to a first bit line and the second signal to a second bit line.

The sense amplifier circuit may further include a comparator latch circuit configured to sense the binary data based on the relative voltage between the reference voltage on one of either the first data line or the second data line and a low voltage on the other one of either the first data line or the second data line. The sense amplifier circuit may further include a data-in transistor electrically connected to the comparator latch circuit and configured to receive a data-in clock which turns on the data-in transistor which activates the comparator latch circuit so as to latch the first signal of the first data line and the second signal of the second data line. The sense amplifier circuit may further include a first data input transistor configured to receive a data-in clock bar signal which turns on the first data input transistor to receive a data input signal for the first data line and a second data input transistor configured to receive the data-in block bar signal which turns on the second data input transistor to receive a data in bar signal for the second data line during a write operation. The data-in clock signal may turn off the data-in transistor and the data-in clock bar signal turns off the first data input transistor and the second data input transistor during a read operation. The sense amplifier circuit may further include a sense amplifier enable transistor configured to receive a sense amplifier enabled signal to turn on the sense amplifier enable transistor which activates the comparator latch circuit to sense the binary data during a read operation, and the sense amplifier enable transistor is turned off during a write operation. The voltage equalizing circuit may include a first voltage equalizing transistor configured to pre-charge the first data line to the reference voltage and a second voltage equalizing transistor configured to pre-charge the second data line to the reference voltage and a write enable transistor configured to receive the data line equalizing bar signal which turns on the write enable transistor to enable the write circuit to write the first signal to the first bit line and the second signal to the second bit line during a write operation. The write circuit may not contain a latch to receive the first signal of the first data line and the second signal of the second data line.

According to an exemplary embodiment, the disclosure is directed to an electronic device having a memory device including a memory circuit which includes not limited to a voltage equalizing circuit configured to equalize and pre-charge a first data line and a second data line to a reference voltage upon receive a data line equalizing bar signal, a sense amplifier circuit electrically connected to the voltage equalizing circuit and configured to sense a binary data based on a relative voltage between the first data line and the second data line and comprising a comparator latch circuit for sensing the binary data and a data-in transistor for controlling the comparator latch circuit, a read-out latch circuit electrically connected to the sense amplifier circuit and configured to receive the binary data which is to be transmitted to an external controller, and a write circuit electrically connected to the voltage equalizing circuit and configured to receive a first signal of the first data line and a second signal of the second data line so as to write the first signal to a first bit line and the second signal to a second bit line.

The comparator latch circuit may be configured to sense the binary data based on the relative voltage between the reference voltage on one of either the first data line or the second data line and a low voltage on the other one of either the first data line or the second data line. The data-in transistor may be electrically connected to the comparator latch circuit and may be configured to receive a data-in clock which turns on the data-in transistor which activates the comparator latch circuit so as to latch the first signal of the first data line and the second signal of the second data line. The sense amplifier circuit may further include a first data input transistor configured to receive a data-in clock bar signal which turns on the first data input transistor to receive a data input signal for the first data line, and a second data input transistor configured to receive the data-in block bar signal which turns on the second data input transistor to receive a data in bar signal for the second data line during a write operation. The data-in clock signal may turn off the data-in transistor and the data-in clock bar signal turns off the first data input transistor and the second data input transistor during a read operation. The sense amplifier circuit may further include a sense amplifier enable transistor configured to receive a sense amplifier enabled signal to turn on the sense amplifier enable transistor which activates the comparator latch circuit to sense the binary data during a read operation, and the sense amplifier enable transistor is turned off during a write operation. The voltage equalizing circuit may include a first voltage equalizing transistor configured to pre-charge the first data line to the reference voltage, a second voltage equalizing transistor configured to pre-charge the second data line to the reference voltage, and a write enable transistor configured to receive the data line equalizing bar signal which turns on the write enable transistor to enable the write circuit to write the first signal to the first bit line and the second signal to the second bit line during a write operation. The write circuit may not contain a latch to receive the first signal of the first data line and the second signal of the second data line.

According to an exemplary embodiment, the disclosure is directed to a method of operating a memory circuit. The method includes not limited to: receiving, by a voltage equalizing circuit, a data line equalizing bar signal to equalize and pre-charge a first data line and a second data line, sensing, by a sense amplifier circuit having a comparator latch circuit which is electrically connected to the voltage equalizing circuit, a binary data based on a relative voltage between the reference voltage on one of either the first data line or the second data line and a low voltage on the other one of either the first data line or the second data line, receiving, by a read-out latch circuit electrically connected to the sense amplifier circuit, the binary data which is to be transmitted to an external controller, and receiving, by a write circuit electrically connected to the voltage equalizing circuit, a first signal of the first data line and a second signal of the second data line so as to write the first signal to a first bit line and the second signal to a second bit line.

The method may further include receiving a data-in block, by using a data-in transistor electrically connected to the comparator latch circuit, to turn on the data-in transistor which activates the comparator latch circuit so as to latch the first signal of the first data line and the second signal of the second data line, receiving, by a first data input transistor, a data-in clock bar signal which turns on the first data input transistor to receive a data input signal for the first data line, receiving, by a second data input transistor, a data-in block bar signal which turns on the second data input transistor to receive a data in bar signal for the second data line during a write operation, wherein the data-in clock signal turns off the data-in transistor and the data-in clock bar signal turns off the first data input transistor and the second data input transistor during a read operation. The method may further include receiving, by the sense amplifier circuit, a sense amplifier enabled signal to turn on the sense amplifier enable transistor which activates the comparator latch circuit to sense the binary data during a read operation, and the sense amplifier enable transistor is turned off during a write operation.

No element, act, or instruction used in the detailed description of disclosed embodiments of the present application should be construed as absolutely critical or essential to the present disclosure unless explicitly described as such. Also, as used herein, each of the indefinite articles "a" and "an" could include more than one item. If only one item is intended, the terms "a single" or similar languages would be used. Furthermore, the terms "any of" followed by a listing of a plurality of items and/or a plurality of categories of items, as used herein, are intended to include "any of", "any combination of", "any multiple of", and/or "any combination of multiples of the items and/or the categories of items, individually or in conjunction with other items and/or other categories of items. Further, as used herein, the term "set" is intended to include any number of items, including zero. Further, as used herein, the term "number" is intended to include any number, including zero.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A memory circuit comprising:
   a voltage equalizing circuit configured to equalize and pre-charge a first data line and a second data line to a reference voltage upon receive a data line equalizing bar signal;
   a sense amplifier circuit electrically connected to the voltage equalizing circuit and configured to sense a binary data based on a relative voltage between the first data line and the second data line;
   a read-out latch circuit electrically connected to the sense amplifier circuit and configured to receive the binary data which is to be transmitted to an external controller; and
   a write circuit electrically and directly connected to the voltage equalizing circuit and configured to receive a first signal of the first data line and a second signal of the second data line so as to write the first signal to a first bit line and the second signal to a second bit line, wherein sense amplifier circuit further comprising:
      wherein sense amplifier circuit comprising a comparator latch circuit configured to sense the binary data based on the relative voltage between the reference voltage on one of either the first data line or the second data line and a low voltage on the other one of either the first data line or the second data line;
      a data-in transistor electrically connected to the comparator latch circuit and configured to receive a data-in clock signal which turns on the data-in transistor which activates the comparator latch circuit so as to latch the first signal of the first data line and the second signal of the second data line;
      a first data input transistor configured to receive a data-in clock bar signal which turns on the first data input transistor to receive a data input signal for the first data line; and
      a second data input transistor configured to receive the data-in clock bar signal which turns on the second data input transistor to receive a data in bar signal for the second data line during a write operation.

2. The memory circuit of claim 1, wherein the data-in clock signal turns off the data-in transistor and the data-in clock bar signal turns off the first data input transistor and the second data input transistor during a read operation.

3. The memory circuit of claim 1, wherein the sense amplifier circuit further comprising a sense amplifier enable transistor configured to receive a sense amplifier enabled signal to turn on the sense amplifier enable transistor which activates the comparator latch circuit to sense the binary data during a read operation, and the sense amplifier enable transistor is turned off during a write operation.

4. The memory circuit of claim 1, wherein the voltage equalizing circuit comprising:
   a first voltage equalizing transistor configured to pre-charge the first data line to the reference voltage;
   a second voltage equalizing transistor configured to pre-charge the second data line to the reference voltage; and
   a write enable transistor configured to receive the data line equalizing bar signal which turns on the write enable transistor to enable the write circuit to write the first signal to the first bit line and the second signal to the second bit line during a write operation.

5. The memory circuit of claim 1, wherein the write circuit does not include a latch to receive the first signal of the first data line and the second signal of the second data line.

6. An electronic device having a memory device comprising a memory circuit, wherein the memory circuit comprising:
   a voltage equalizing circuit configured to equalize and pre-charge a first data line and a second data line to a reference voltage upon receive a data line equalizing bar signal;
   a sense amplifier circuit electrically connected to the voltage equalizing circuit and configured to sense a binary data based on a relative voltage between the first data line and the second data line and comprising a comparator latch circuit for sensing the binary data and a data-in transistor for controlling the comparator latch circuit;
   a read-out latch circuit electrically connected to the sense amplifier circuit and configured to receive the binary data which is to be transmitted to an external controller; and a write circuit electrically and directly connected to the voltage equalizing circuit and configured to receive a first signal of the first data line and a second signal of the second data line so as to write the first signal to a first bit line and the second signal to a second bit line, wherein the data-in transistor is electrically connected to the comparator latch circuit and is configured to receive a data-in clock signal which turns on the data-in transistor which activates the comparator latch circuit so as to latch the first signal of the first data line and the second signal of the second data line, wherein sense amplifier circuit further comprising:
- a first data input transistor configured to receive a data-in clock bar signal which turns on the first data input transistor to receive a data input signal for the first data line; and
- a second data input transistor configured to receive the data-in clock bar signal which turns on the second data input transistor to receive a data in bar signal for the second data line during a write operation.

7. The electronic device of claim 6, wherein the comparator latch circuit is configured to sense the binary data based on the relative voltage between the reference voltage on one of either the first data line or the second data line and a low voltage on the other one of either the first data line or the second data line.

8. The electronic device of claim 6, wherein the data-in clock signal turns off the data-in transistor and the data-in clock bar signal turns off the first data input transistor and the second data input transistor during a read operation.

9. The electronic device of claim 6, wherein the sense amplifier circuit further comprising a sense amplifier enable transistor configured to receive a sense amplifier enabled signal to turn on the sense amplifier enable transistor which activates the comparator latch circuit to sense the binary data during a read operation, and the sense amplifier enable transistor is turned off during a write operation.

10. The electronic device of claim 6, wherein the voltage equalizing circuit comprising:
- a first voltage equalizing transistor configured to pre-charge the first data line to the reference voltage;
- a second voltage equalizing transistor configured to pre-charge the second data line to the reference voltage; and
- a write enable transistor configured to receive the data line equalizing bar signal which turns on the write enable transistor to enable the write circuit to write the first signal to the first bit line and the second signal to the second bit line during a write operation.

11. The electronic device of claim 6, wherein the write circuit does not include a latch to receive the first signal of the first data line and the second signal of the second data line.

12. A method of operating a memory circuit comprising:
receiving, by a voltage equalizing circuit, a data line equalizing bar signal to equalize and pre-charge a first data line and a second data line;

sensing, by a sense amplifier circuit having a comparator latch circuit which is electrically connected to the voltage equalizing circuit, a binary data based on a relative voltage between the reference voltage on one of either the first data line or the second data line and a low voltage on the other one of either the first data line or the second data line;

receiving, by a read-out latch circuit electrically connected to the sense amplifier circuit, the binary data which is to be transmitted to an external controller;

receiving, by a write circuit electrically and directly connected to the voltage equalizing circuit, a first signal of the first data line and a second signal of the second data line so as to write the first signal to a first bit line and the second signal to a second bit line;

receiving a data-in clock signal, by using a data-in transistor electrically connected to the comparator latch circuit, to turn on the data-in transistor which activates the comparator latch circuit so as to latch the first signal of the first data line and the second signal of the second data line;

receiving, by a first data input transistor, a data-in clock bar signal which turns on the first data input transistor to receive a data input signal for the first data line; and receiving, by a second data input transistor, a data-in clock bar signal which turns on the second data input transistor to receive a data in bar signal for the second data line during a write operation, wherein the data-in clock signal turns off the data-in transistor and the data-in clock bar signal turns off the first data input transistor and the second data input transistor during a read operation.

13. The method of claim 12 further comprising:
receiving, by the sense amplifier circuit, a sense amplifier enabled signal to turn on the sense amplifier enable transistor which activates the comparator latch circuit to sense the binary data during a read operation, and the sense amplifier enable transistor is turned off during a write operation.

* * * * *

UNITED STATES PATENT AND TRADEMARK OFFICE
CERTIFICATE OF CORRECTION

| | | |
|---|---|---|
| PATENT NO. | : 11,264,081 B1 | |
| APPLICATION NO. | : 17/006882 | |
| DATED | : March 1, 2022 | |
| INVENTOR(S) | : Hua-Hsin Yu et al. | |

It is certified that error appears in the above-identified patent and that said Letters Patent is hereby corrected as shown below:

On the Title Page

Item (73) Assignee should read: Taiwan Semiconductor Manufacturing Company, Ltd., Hsinchu, (TW)

Signed and Sealed this
Fifth Day of July, 2022

*Katherine Kelly Vidal*

Katherine Kelly Vidal
*Director of the United States Patent and Trademark Office*